United States Patent [19]

Murayama

[11] Patent Number: 5,783,039
[45] Date of Patent: Jul. 21, 1998

[54] WHOLLY AROMATIC POLYAMIDE FIBER SHEET

[75] Inventor: Sadamitsu Murayama, Ibaraki, Japan

[73] Assignee: Teijin Limited, Osaka, Japan

[21] Appl. No.: 800,803

[22] Filed: Feb. 14, 1997

[30] Foreign Application Priority Data

Feb. 19, 1996 [JP] Japan .................. 8-030426

[51] Int. Cl.$^6$ ................ D21H 5/12; D21F 11/00
[52] U.S. Cl. ........... 162/146; 162/157.3; 162/163; 162/164.1; 162/164.3; 174/255; 442/169; 442/415; 428/209; 428/901
[58] Field of Search ............... 442/117, 147, 442/168, 169, 415; 525/432; 162/146, 157.3, 164.1, 163, 164.3; 428/901, 209; 174/255

[56] References Cited

U.S. PATENT DOCUMENTS 4,698,267 10/1987 Tokarsky .................. 428/474.4

FOREIGN PATENT DOCUMENTS

| A192233 | 4/1989 | Japan . |
| A247392 | 2/1990 | Japan . |
| A2236907 | 9/1990 | Japan . |
| A46708 | 1/1992 | Japan . |

*Primary Examiner*—Ana Woodward
*Attorney, Agent, or Firm*—Sughrue, Mion, Zinn, Macpeak & Seas, PLLC

[57] ABSTRACT

A wholly aromatic polyamide staple fiber fabric having excellent insulation and superior dimensional stability at a high temperature and/or a high humidity, includes 70 to 96 parts by weight of a staple fiber web made from a blend of 5 to 30% by weight of m-type wholly aromatic polyamide staple fibers and 70 to 95% by weight of p-type wholly aromatic polyamide staple fibers, and 4 to 30 parts by weight of an organic resin binder incorporated into the staple fiber web.

11 Claims, No Drawings

WHOLLY AROMATIC POLYAMIDE FIBER SHEET

BACKGROUND OF THE INVENTION

1. Field of the Invention

The present invention relates to a wholly aromatic polyamide fiber sheet. More particularly, the present invention relates to a wholly aromatic polyamide sheet in the form of a paper sheet, having an excellent heat resistance and an electric insulating property at a high humidity, and useful for the manufacture of laminates usable for electric circuit boards.

The wholly aromatic polyamide fiber sheet of the present invention is made principally from a staple fiber component comprising a blend of meta-type wholly aromatic polyamide staple fibers and para-type wholly aromatic polyamide stable fibers and a binder component comprising at least one organic resinous material.

2. Description of the Related Art

A substrate for a laminate usable for electric circuit boards is required to have various advantageous properties, for example, high heat resistance, dimensional stability under high and low temperature and high and low humidity conditions, electric insulating property, resistance to deformation (, for example, distortion, curling and corrugation) and a light weight. Aromatic polyamide fiber sheets are excellent in the heat resistance, electric insulating property, thermal dimensional stability and light weight, in comparison with those of the conventional sheets made from the materials different from the aromatic polyamide fiber materials, and are thus currently being utilized as a substrate material for the laminates for the electric circuit boards. For example, Japanese Unexamined Patent Publication No. 61-160500 discloses a high density para-aramid sheet comprising a binder component consisting of meta-type aromatic polyamide fibrids and a stable fiber component consisting of a blend of para-type aromatic polyamide staple fibers, for example, Kevlar (trademark) fibers, made by Du Pont, with fibrillated para-type aromatic polyamide fine fibers, for example, Kevlar (trademark) fine fibers, made by Du Pont. In this sheet, the para-type aramid fibers and fibrillated fine fibers are bonded to each other through the meta-type aramid fibrids. This type of the aramid fiber sheet exhibits excellent heat resistance, dimensional stability for temperature and humidity, and resistance to deformation including, for example, distortion, curling and corrugation. However, the meta-type aromatic polyamide fibrids per se have are disadvantageous in high equilibrium water content and impurity ion content derived from the process for producing the same. Also, since the gaps between the p-aramid staple fibers are filled by the fibrillated fine fibers, and the those staple fibers and fibrillated fine fibers are bonded to each other through the m-aramid fibrids, the resultant sheet exhibits a poor impregnation property for a varnish composition including, for example, an epoxy resin when the sheet is impregnated with the varnish to provide a substrate sheet for electric circuit boards. Accordingly, the sheet is impregnated unevenly and/or insufficiently by the varnish composition, and thus the resultant electric circuit board exhibits a defect in electric insulating property.

Japanese Unexamined Patent Publications No. 2-236907 and No. 4-6708 disclose an electric insulating sheet made from meta-type aramid staple fibers and meta-type aramid pulp fibers (fibrids). This type of conventional electric insulating sheet is unsatisfactory in heat resistance and electric insulating property, because the meta-type aramid fibers exhibit a lower heat resistance than that of para-type aramid fibers and a relatively high equilibrium water content and thus a relatively low electric insulating property in comparison with the para-type aramid fibers. Also, the m-aramid fibrids used as a binder cause the impregnation property of the resultant electric insulating sheet with a varnish composition to be low when an electric circuit board is produced from the sheet. Japanese Unexamined Patent Publication No. 1-92233 discloses an aramid fiber sheet comprising poly(paraphenylene terephthalamide staple fibers (Kevlar, trademark, made by Du Pont) and an organic resinous binder. This type of conventional sheet is unsatisfactory in dimensional stability and electric insulating property because although the p-aramid fibers exhibit an excellent heat resistance, the p-aramid fibers not only shrink upon heat treatment at a high temperature of 250° C. or more to change the dimensions thereof, but also exhibit a high equilibrium water content and a high content of impurity ions. Also, in the conventional p-aramid fiber sheet, the organic resinous binder tends to migrate to the front and back surface side of the sheet and to be unevenly distributed in the sheet, and thus exhibit a reduced uniformity in quality in the direction of the thickness of the sheet.

Accordingly, the conventional p-aramid fiber sheet exhibits an unsatisfactory electric insulating property when exposed to a high humidity environment for a long period of time and thus is not suitable as an electric insulating substrate material which is required to exhibit a high reliability.

Japanese Unexamined Patent Publication No. 2-47392 discloses a process for producing an aromatic polyamide fiber sheet from copoly(p-phenylene-3,4'-oxydiphenylene terephthalate) staple fibers (Technora, trademark, made by Teijin) and an organic resinous binder having a reduced metal content. This type of conventional sheet has reduced equilibrium water content and impurity content and thus exhibits a satisfactory electric insulating property. However, this conventional sheet is unsatisfactory in uniformity in quality and thus in reliability because the organic resinous binder migrates to the front and back surface portions of the sheet so that the amount of the binder located in the middle portion of the sheet decreases, and thus the distribution of the organic resinous binder in the sheet becomes uneven in the direction of the thickness of the sheet.

When the above-mentioned type of conventional sheet in which the organic resinous binder is unevenly distributed is used as a substrate material for electric circuit boards, the sheet is subjected to a prepreg-preparation step in which the sheet is impregnated with a varnish composition containing, for example, an epoxy resin, and dried, and a prepreg-lamination and shaping step. During the steps, the uneven distribution of the organic resinous binder causes the impregnation and adhesion of the varnish composition to become uneven, a portion of the binder to be fused so as to reduce the adhesion of the staple fibers to each other, and thus the sheet per se to be broken. Also, due to the uneven distribution of the resinous binder, the staple fibers unevenly move from each other and thus the distribution of the staple fibers in the sheet becomes uneven. Further, the resultant laminate for the electric circuit boards is sometimes deformed after a solder reflow step at a high temperature.

Accordingly, it has been strongly demanded to provide a new type of aromatic polyamide fiber sheet having a high receiving capacity for the electric insulating resin, a high heat resistance and an excellent dimensional stability and thus being free from the above-mentioned disadvantages of the conventional sheet.

SUMMARY OF THE INVENTION

An object of the present invention is to provide a wholly aromatic polyamide staple fiber sheet having an excellent heat resistance and superior electric insulation under a high humidity condition and thus usable as a substrate material for electric circuit boards.

Another object of the present invention is to provide a wholly aromatic polyamide staple fiber sheet having a high resistance to deformation, for example, distortion, curling and corrugation, which occurs during the process for producing a laminate for electric circuit board from the staple fiber sheet, and a superior electric insulation.

The above-mentioned objects can be attained by the wholly aromatic polyamide staple fiber sheet of the present invention, which comprises (A) 70 to 96 parts by weight of a staple fiber component comprising a blend of:

(a) 5 to 30% by weight of meta-type wholly aromatic polyamide staple fibers, and (b) 70 to 95% by weight of para-type wholly aromatic polyamide staple fibers, and (B) 4 to 30 parts by weight of a binder component comprising at least one organic resinous material, through which binder component (B) the staple fibers (a) and (b) in the staple fiber component (A) are bonded with each other to form a paper-like sheet.

DESCRIPTION OF THE PREFERRED EMBODIMENTS

The inventors of the present invention have careful studied a wholly aromatic polyamide staple fiber sheet having a satisfactory impregnating property with an electric insulating varnish, a uniform distribution of a resinous binder and wholly aromatic polyamide staple fibers throughout the sheet, an enhanced dimensional stability even at a high humidity and a high resistance to deformation.

As a result, it was found that when the wholly aromatic polyamide staple fiber sheet was formed from a blend of a major amount of para-type wholly aromatic polyamide staple fiber which had a low impurity ion content, an equilibrium water content, and high heat resistance and dimensional stability to changing in temperature, with a minor amount of meta-type wholly aromatic polyamide staple fiber, and a binder comprising an organic resinous material, the resultant fiber sheet was free from uneven distribution of the binder in the direction of the thickness of the sheet and thus had a uniform quality. Also, it was found that the para-type wholly aromatic polyamide staple fibers could be bonded to the meta-type wholly aromatic polyamide staple fibers which were partially heat-softened and served as thermal bonding fibers, at portions of the staple fibers intersecting each other, without using the conventional fine fibrillated fibers or fibrids. Namely, in the resultant sheet, the gaps between the staple fibers are not filled by the fine fibrillated fibers or fibrids. Accordingly, the resultant staple fiber sheet had a uniform staple fiber-distribution and exhibited an enhanced impregnating property with a varnish composition which was applied to the sheet in a prepreg-preparation step and an improved cutting property. Also, the resultant laminate for electric circuit boards produced from the above-mentioned staple fiber sheet exhibited an enhanced dimensional stability at a high temperature and/or at a high humidity. Further, the resultant laminate exhibited a high resistance to deformation during the electric circuit board-producing procedure and a decreased reduction in electric insulating property at a high humidity. The present invention was completed based on the above-mentioned finding.

The wholly aromatic polyamide staple fiber sheet of the present invention comprises (A) 70 to 96 parts by weight, preferably 75 to 90 parts by weight of a staple fiber web comprising a blend of:

(a) 5 to 30% by weight, preferably 10 to 25% by weight of meta-type wholly aromatic polyamide staple fibers, and (b) 70 to 95% by weight, preferably 75 to 90% by weight of para-type wholly aromatic polyamide staple fibers, and (B) 4 to 30 parts by weight, preferably 10 to 25 parts by weight of a binder comprising at least one organic resinous material, and incorporated into the staple fiber web (A).

The wholly aromatic polyamide staple fiber sheet may be in the form of a paper-like sheet, a nonwoven fabric or the like.

The wholly aromatic polyamide usable for the present invention contains preferably 80 to 100 molar %, more preferably 90 to 100 molar % of recurring units of the formula (1):

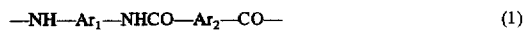

—NH—Ar$_1$—NHCO—Ar$_2$—CO—  (1)

wherein Ar$_1$ and Ar$_2$ represent respectively and independently from each other, a divalent aromatic group selected from, for example, those of the following formulae:

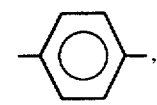 (a)

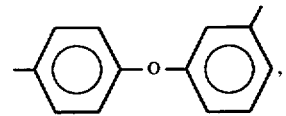 (b)

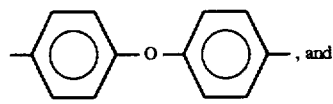 (c)

, and

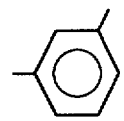 (d)

These divalent aromatic groups are optionally substituted by at least one substituent selected from halogen atoms and lower alkyl groups having, for example, 1 to 3 carbon atoms. The processes for producing the wholly aromatic polyamide and fibers thereof are disclosed in, for example, UK Patent No. 1,501,948, U.S. Pat. Nos. 3,733,964, 3,767,756 and 3,869,429, Japanese Unexamined Patent Publication Nos. 49-100,322, 47-10,863, 58-144,152 and 4-65,513.

In the present invention, the term "para-type wholly aromatic polyamide" refers to a wholly aromatic polyamide having 80 to 100 molar % of the recurring units of the formula (1) wherein 50 molar % or more of the divalent aromatic groups represented by Ar$_1$ have a para-structure and 50 molar % or more of the divalent aromatic groups represented by Ar$_2$ have a para-structure.

Also, the term "meta-type wholly aromatic polyamide" refers to a wholly aromatic polyamide having 80 to 100 molar % of the recurring units of the formula (1) wherein all of the divalent aromatic groups represented by one of Ar$_1$ and Ar$_2$ are have a meta-structure, and at least 50 molar % of the divalent aromatic groups represented by the other one of Ar$_1$ and Ar$_2$ has a meta-structure.

For example, the para-type wholly aromatic polyamide usable for the present invention comprises 80 to 100 molar % of the recurring units of the formula (1) wherein 50 to 100 molar % of each of $Ar_1$ and $Ar_2$ are of the formula (a) or (c), for example, and 0 to 50 molar % of each of $Ar_1$ and $Ar_2$ are of the formula (b) or (d).

The para-type wholly aromatic polyamide may be selected from, for example, poly(paraphenylene terephthalamide) and copoly(paraphenylene/3,4'-oxydiphenylene (molar ratio: 50–100/0–50) terephthalamide).

The meta-type wholly aromatic polyamide may be selected from, for example, poly(metaphenylene isophthalamide), poly(3,4'-oxydiphenylene, isophthalamide), and poly(metaxylene isophthalamide).

The copoly(paraphenylene/3,4'-oxydiphenylene terephthalate) fibers (available under a trademark of Technora, from Teijin Limited) have a low impurity ion content and thus useful as an electric insulating material.

The copoly(paraphenylene/3,4'-oxydiphenylene terephthalate) staple fibers usable for the present invention preferably have solid, cation-exchangeable, non-ion-absorbing inorganic compound particles fixed to the surfaces of the fibers. The inorganic compound particles fixed to the fiber surfaces are contributory to enhancing the impregnating property of the resultant staple fiber sheet of the present invention with the varnish composition and the adhesion of the varnish composition with the polyamide fibers. Due to the above-mentioned enhancement, the resultant wholly aromatic polyamide staple fiber sheet exhibits an increased resistance to deformation during the process for producing the laminate for the electric circuit board and the resultant laminate exhibits enhanced electric insulating property and dimensional stability at high humidity.

The solid, cation-exchangeable, non-ion-absorbing inorganic compound is capable of exchanging cations and of absorbing non-ionic substance, and can be selected from, for example, silica, alumina, silica-magnesia complex, kaolin, acid terra abla, activated clay, talc, bentonite and hydrated aluminum silicate. The inorganic compound particles fixed to the surfaces of the staple fibers are contributory to enhancing the bonding property of the staple fiber surfaces. The particles preferably have a particle size of 0.01 to 5 µm, more preferably 0.01 to 3 µm. To fix the inorganic compound particles, the staple fiber surfaces, the inorganic compound particles are attached to the staple fiber surfaces at the softening temperature of the staple fibers and pressed so as to bite into the staple fiber surfaces.

The aromatic polyamide staple fibers (a) and (b) preferably have an individual fiber thickness of 0.1 to 10 deniers (0.11 to 11.1 d tex), preferably 0.3 to 5.0 deniers (0.33 to 5.5 d tex). Generally, the aromatic polyamide staple fibers (a) and (b) having an individual fiber thickness less than 0.1 denier (0.11 d tex), are difficult to produce without generating breakage or fibrillation of the fibers. Therefore, it is difficult to produce the aromatic polyamide staple fibers having a satisfactory quality at a high process stability and efficiency, with a reasonable cost. However, if the individual fiber thickness is more than 10 deniers (11.1 d tex), the resultant staple fibers may exhibit unsatisfactory mechanical strength, especially, tensile strength, and thus may not be suitable for practical uses.

In the present invention, the aromatic polyamide fibers (a) and (b) may be slightly fibrillated by mechanical means. However, if the degree of fibrillation is too high, the resultant fiber sheet exhibits a reduced capacity of impregnating with the varnish composition, and thus a reduced utilizability for producing the electric circuit board therefrom. Therefore, the degree of fibrillation should be as low as possible.

The aromatic polyamide staple fibers (a) and (b) usable for the present invention preferably has a fiber length of 0.5 to 80 mm, more preferably 1 to 60 mm. Particularly, when the fibers are produced by a wet process, the fiber length is preferably 2 to 12 mm. If the fiber length is less than 0.5 mm, the resultant aromatic polyamide fiber sheet may exhibit an unsatisfactory mechanical strength. Also, if the fiber length is more than 80 mm, the resultant staple fiber may exhibit unsatisfactory opening property and dispersing property, and thus the resultant fiber sheet may have an insufficient uniformity and an unsatisfactory mechanical strength.

The fiber sheet of the present invention optionally further comprises a small amount of para-type aromatic polyamide fibers fibrillated by applying a mechanical shearing force thereto, to control a percentage of spaces formed in the aromatic polyamide fiber sheet to an appropriate level, and to increase a bulk density of the fiber sheet. However, if the amount of the fibrillated fibers is too high, the resultant fiber sheet may exhibit a reduced capacity for receiving the varnish composition and thus the resultant electric circuit board may exhibit an unsatisfactory electric insulating property. Therefore, the amount of the fibrillated para-type aromatic polyamide fibers in the fiber sheet should be restricted to a level of 15% by weight or less, preferably 10% by weight or less, based on the weight of the para-type aromatic polyamide staple fibers (b). In the wholly aromatic polyamide fiber sheet of the present invention, the stable fiber web comprises 5 to 30% by weight, preferably 8 to 20% by weight of the meta-type wholly aromatic polyamide staple fibers (a) and 70 to 95% by weight, preferably 80 to 92% by weight of the para-type wholly aromatic polyamide staple fibers (b).

Generally, the meta-type wholly aromatic polyamide staple fibers (a) has higher equilibrium water content and impurity ion content than those of the wholly aromatic polyamide staple fibers (b). If the content of the meta-type staple fibers (a) is more than 30% by weight, the resultant fiber sheet exhibits an unsatisfactory electric insulating property, particularly, at a high humidity, and thus is unsuitable as a substrate material for the laminate for the electric circuit board which is required to maintain a high level of reliability over a long period of time.

The meta-type wholly aromatic polyamide staple fibers (a) can be softened at a lower temperature of, for example, 280° to 330° C., than the softening temperature of the para-type wholly aromatic polyamide staple fibers (b), and bonded to the para-type staple fibers (b) at portions thereof intersecting each other under pressure. Therefore, the meta-type staple fibers can serve as a fibrous binder for the para-type staple fibers (b). If the content of the meta-type wholly aromatic polyamide staple fibers (a) in the staple fiber web (A) is less than 5% by weight, the meta- and para-type staple fibers (a) and (b) cannot be bonded to each other to a satisfactory extent.

To ensure that the meta-type wholly aromatic polyamide staple fibers (a) exhibit a satisfactory bonding property, the meta-type staple fibers (a) are preferably selected from undrawn ones and drawn ones at a draw ratio of 2.8 or less, more preferably 1.1 to 1.5. Also, for the above-mentioned purpose, it is preferable that the thermal history applied to the meta-type staple fibers during the production procedures thereof is as small as possible. If the draw ratio is larger than 2.8 or the thermal history is too large, the resultant meta-type staple fibers (a) exhibit too high a crystallinity and thus an undesirably increased softening temperature, and therefore become difficult to effectively serve as thermal bonding fibers.

The wholly aromatic polyamide fiber sheet of the present invention optionally further comprises additional staple fibers which are different from the meta-type and para-type aromatic polyamide staple fibers (a) and (b) and are incorporated into the staple fiber web (A). The additional staple fibers should be in an amount in which the performance of the meta-type and para-type aromatic polyamide staple fibers (a) and (B) is not hindered. The additional staple fibers may be selected from, for example, glass fibers, polyetheretherketone fibers, polyetherimide fibers, polyphenylenesulfide fibers and ceramic fibers. Also, when the additional staple fibers are contained, the total content of the meta-type and para-type aromatic polyamide staple fibers (a) and (b) in the resultant staple fiber web should be 80% by volume or more, preferably 90% by volume or more.

The wholly aromatic polyamide fiber sheet of the present invention optionally further comprises a small amount of a meta-type wholly aromatic polyamide particles in the form of spheres, flakes or scales, as an additional solid binder. The additional solid binder particles enter into and fill the gaps between the meta- and para-type staple fibers (a) and (b). Therefore, if the amount of the additional solid binder particles is too much, the resultant fiber sheet may exhibit a reduced impregnating property with the varnish composition in the prepreg-preparation step from the fiber sheet, and thus may be impregnated unevenly and/or insufficiently with the varnish composition. Accordingly, the amount of the meta-type aromatic polyamide particles should be restricted to 15% by weight or less, preferably 10% by weight or less, based on the weight of the meta-type wholly aromatic polyamide staple fibers (a).

In the present invention, it has been found that the para-type aromatic polyamide staple fibers (b) usable for the present invention include ones which elongate along the longitudinal axes thereof when the staple fibers (b) are heat-dried or dehydrated, and the meta-type wholly aromatic polyamide staple fibers (a) usable for the present invention include ones which shrink along the longitudinal axes thereof when heat-dried or dehydrated. Therefore, the elongatable para-type wholly aromatic polyamide staple fibers (b) are used in combination with the shrinkable meta-type wholly aromatic polyamide staple fibers (a), the resultant staple fiber web (A) can exhibit a significantly enhanced dimensional stability even when the web is heat-dried or dehydrated, or water-absorbed or hydrated.

In the present invention, preferably the meta-type wholly aromatic polyamide staple fibers (a) have a shrinkage of 0.10 to 10.0%, more preferably 0.5 to 7.0% and the para-type wholly aromatic polyamide staple fibers (b) have an elongation of 0.03 to 1.0%, preferably 0.05 to 0.8%.

The shrinkage or elongation can be controlled by adjusting the production conditions, particularly the heat-drawing conditions, of the staple fibers (a) or (b). Also, when the shrinkage and the meta-type staple fibers (a) and the elongation of the para-type staple fibers are controlled as mentioned above, the resultant fiber sheet, laminate or electric circuit board exhibits an enhanced resistance to deformation, for example, distortion, curling or corrugation, and significantly enhanced dimensional stability at a high temperature and a high humidity.

The shrinkage of the meta-type wholly aromatic polyamide staple fibers (a) and the elongation of the para-type wholly aromatic polyamide staple fibers (b) are determined by the following measurement method.

In the shrinkage and elongation measurement method, (i) the staple fibers (a) or (b) are immersed in water at room temperature for 24 hours, to allow the staple fibers to absorb water, and are dried at room temperature; (ii) the water-absorbed staple fibers (a) or (b) are heated from room temperature to a temperature of 300° C. at heating rate of 10° C./minute, to dry the water-absorbed staple fibers (a) or (b); (iii) the heated staple fibers (a) or (b) are immediately cooled from 300° C. to room temperature at a cooling rate of 10° C./minute, (iv) the heating and cooling steps (ii) and (iii) are repeated further twice; and (v) the shrinkage of the staple fibers (a) and the elongation of the staple fibers (b) are calculated in accordance with the equations (I) and (II), respectively:

$$S(\%) = \frac{L_1 - L_2}{L_1} \times 100 \quad (I)$$

and $$E(\%) = \frac{L_4 - L_3}{L_3} \times 100 \quad (II)$$

wherein S represents a shrinkage in % of the staple fiber (a), $L_1$ represents a length of the staple fibers (a) after the water-immersing and drying step (i) and before the first heating step (ii), $L_2$ represents a length of the staple fibers (a) after the final cooling step, E represents an elongation in % of the staple fibers (b), $L_3$ represents a length of the staple fibers (b) after the water-immersing step (i) and before the first heating step (ii), and $L_4$ represents a length of the staple fibers (b) after the final cooling step. The elongatable meta-type wholly aromatic polyamide staple fibers (a) are preferably selected from poly(metaphenylene isophthalamide) staple fibers. Also, the shrinkable para-type wholly aromatic polyamide staple fibers (b) are preferably selected from poly(paraphenylene terephthalamide) staple fibers and copoly(paraphenylene/3,4'-oxydiphenylene (in a copolymerization molar ratio of 50 or more/50 or less) terephthalamide) staple fibers.

When the staple fiber web (A) comprises a blend of the meta-type wholly aromatic polyamide staple fibers (a) having a shrinkage of 0.10 to 10.0% determined as mentioned above with the para-type wholly aromatic polyamide staple fibers (b) having an elongation of 0.03 to 1.0% determined as mentioned above, the resultant fiber sheet exhibit an excellent dimension stability even when used as a substrate material for a laminate for an electric circuit board which is produced by a process including repeated water-washing and drying procedures applied to the substrate material. In the wholly aromatic polyamide fiber sheet of the present invention, the binder (B) to be incorporated into the staple fiber web (A) comprises at least one organic resinous material, particularly organic thermosetting resinous materials, for example, epoxy resins, phenolic compound-formaldehyde resins, polyurethane resins and metamine-formaldehyde resins. Among these resinous materials, the epoxy resins which comprise at least one epoxy functional group per molecule and are dispersible in an aqueous medium and have a high compatibility with the varnish composition to be impregnated in the resultant wholly aromatic polyamide fiber sheet in the prepreg-preparation step are most preferable.

The binder (B) is employed in an amount of 4 to 30 parts by weight, preferably 6 to 15 parts by weight, per 100 parts of the total weight of the staple fiber web (A) and the binder (B). If the amount of the binder (B) is less than 4 parts by weight, the staple fibers (a) and (b) cannot be satisfactorily bonded to each other through the binder (B) in the formation of the staple fiber web (A) by, for example, a paper-forming procedure, and therefore, the resultant fiber sheet does not exhibit a sufficient mechanical strength, for example, tensile strength. Also, the insufficient amount of the binder (B) results in easy breakage of the resultant fiber sheet during a calendering step and/or a prepreg-preparation step including an impregnation of the fiber sheet with a varnish composition.

Also, if the amount of the binder is more than 30% by weight, the resultant fiber sheet exhibits a reduced impregnating property with the varnish composition, and thus the varnish composition is impregnated unevenly or defectively in the fiber sheet, and the role of the varnish composition cannot be sufficiently attained. Also, the resultant fiber sheet is unsuitable as a substrate material for the laminate for the electric circuit board.

When the aromatic polyamide staple fiber sheet of the present invention is utilized as a substrate for a laminate for electric circuit board, the dimensional stability and resistance to deformation (for example, distortion, curling and corrugation) under various temperature and humidity conditions are significantly influenced by bulk density, tensile strength and interlaminar peeling strength of the fiber sheet. Accordingly, preferably the bulk density of the fiber sheet is adjusted to 0.45 to 0.80 g/cm$^3$, more preferably 0.55 to 0.65 g/cm$^3$, the tensile strength of the fiber sheet to 2.0 kg/15 mm or more, more preferably 3.5 to 7.5 kg/15 mm, and the interlaminar peeling strength to 15 g/15 mm or more, more preferably 30 to 50 g/15 mm. If the bulk density and/or the interlaminar peeling strength of the fiber sheet is 0.45 g/cm$^3$ or less and/or 15 g/15 mm or less, the staple fibers located in the middle layer portion of the fiber sheet may exhibit a reduced bonding property to each other, and may allow the varnish composition to be impregnated in too large an amount in the middle layer portion, this increased amount of the impregnated varnish composition may promote the undesirable local movement of the staple fibers in the middle layer portion, and thus the staple fibers may be distributed unevenly in the inside of the resultant laminate for the electric circuit board. The uneven distribution of the staple fibers may cause the dimensional stability and resistance to deformation under various temperature and humidity condition to be decreased.

Also, if the tensile strength of the fiber sheet is less than 2.0 kg/15 mm, the resultant fiber sheet may exhibit an unsatisfactory resistance to breakage during the varnish composition-impregnation procedure. Further, if the bulk density of the fiber sheet is more than 0.80 g/cm$^3$, the resultant fiber sheet may exhibit an unsatisfactory impregnation capacity for the varnish composition, and thus the resultant laminate for electric circuit board may have unsatisfactory electric insulating property, dimensional stability and deformation resistance under high temperature and high humidity conditions.

The wholly aromatic polyamide staple fiber web (A) can be produced by any of the conventional web-forming methods. For example, the meta-type wholly aromatic polyamide staple fibers (a) and the para-type wholly aromatic polyamide staple fibers (b) are blended in a predetermined blending weight ratio; a predetermined weight of the blend is dispersed in a consistency of 0.15 to 0.40% weight in water to provide an aqueous staple fiber slurry; optionally, an additive, for example, a dispersing agent or a viscosity-regulating agent, is added to the aqueous staple fiber slurry; the resultant aqueous staple fiber slurry is subjecting to wet paper-forming procedures using a wire paper machine or cylinder paper machine to provide a wet paper-like sheet; a binder (B) comprising at least one organic resinous material is incorporated in a predetermined solid amount to the wet paper-like sheet by means, for example, a spraying method; the binder-incorporated wet paper-like sheet is dried to provide a dry wholly aromatic polyamide staple fiber sheet. Optionally, a resultant staple fiber sheet is subjected to a finishing step including a heat treatment and/or a pressing treatment, to adjust the thickness, bulk density, mechanical strength and peeling strength thereof respectively to desired levels.

In another process, the meta-type wholly aromatic polyamide staple fibers (a) and the para-type wholly aromatic polyamide staple fibers (b) are blended in a predetermined weight ratio, the resultant blended staple fibers (a) and (B) are opened at random by using high speed fluid streams and accumulated on a web-forming belt to form a wet web of the staple fiber blend; the binder (B) is applied in a predetermined dry amount onto the wet web of the staple fiber (a) and (b) blend to incorporate the binder (B) into the wet web; and the binder-applied wet web is heat-pressed and dried to form a target wholly aromatic polyamide staple fiber sheet.

As mentioned above, when the staple fiber sheet of the present invention is used as a substrate sheet of the laminate for the electric circuit board, the dimensional stability and deformation (distortion, curling and corrugation) resistance under various temperature and humidity of the resultant laminate are often influenced by the bulk density, tensile strength and interlaminar peeling strength of the staple fiber sheet. Accordingly, the staple fiber sheet-preparation process is preferably controlled in wet sheet-forming conditions and drying and heat-pressing conditions so that the resultant staple fiber sheet exhibits the above-mentioned levels of bulk density, tensile strength and interlaminar peeling strength. Especially, the heat-pressing procedure is important and should be carefully controlled. For example, when the heat-pressing procedure is effected by using a calender machine, the staple fiber sheet is preferably heat-pressed between a hard roll having a diameter of about 15 to 80 cm and an elastic roll having a diameter of about 30 to 100 cm and provided with a peripheral surface portion which is deformable or between a pair of hard rollers having a diameter of about 20 to 80 cm. During the heat-pressing procedure, the meta-type wholly aromatic polyamide staple fibers (a) are softened and press-bonded to the para-type wholly aromatic polyamide staple fibers (b) at portions thereof intersecting each other, and the staple fibers (a) and (b) are further bonded to each other through the binder (B) incorporated into the staple fiber web (A). For the bonding purpose, the heat-pressing procedure is carried out preferably at a temperature of 240° C. or more, more preferably 280° to 360° C. under a linear pressure of 150 kg/cm or more, more preferably 180 to 400 kg/cm. Especially, the heat-pressing procedure is effected between a pair of the above-mentioned hard rollers.

If the heating temperature is less than 240° C. and/or the pressure is less than 150 kg/cm, the resultant staple fiber sheet may exhibit a tensile strength of less than 2.0 kg/15 mm, an interlaminar peeling strength of less than 15 g/15 mm and/or a bulk density of less than 0.45 g/cm$^3$.

Also, in the production of the laminate for the electric circuit board from the staple fiber sheet, the staple fiber sheet must pass through a heat treatment at a temperature of 240° C. or more. Accordingly, creation of a heat history of the staple fiber sheet at a temperature equal to or higher than the heat treatment temperature, before the heat treatment, is contributory to preventing undesirable dimensional changes and formation of internal strain of the staple fiber sheet during the heat treatment. Therefore, this pre-treatment is contributory to enhancing the dimensional stability and deformation resistance of the resultant laminate formed from the staple fiber sheet, at a high temperature.

According to the experience of the inventors of the present invention, the heat-pressing procedure for the staple fiber sheet of the present invention is preferably carried out by using a calender at a temperature of 280° C. to 360° C. under a linear pressure of 180 to 400 kg/cm. After the above-mentioned heat-pressing procedure is applied, the resultant staple fiber sheet of the present invention can exhibit a change in dimension of 0.25% or less by a heat treatment at a temperature of 280° C. for 5 minutes and a bulk density in the range of from 0.45 to 0.80 g/cm$^3$.

However, if the heat-pressing treatment is applied at a temperature higher than 360° C. and/or under a pressure higher than 400 kg/cm, the resultant staple fiber sheet may have a bulk density more than 0.8 g/cm$^3$.

EXAMPLES

The present invention will be further illustrated by the following examples. In the examples, the resultant products are subjected to the following tests.

(1) Bulk density of staple fiber sheet

The bulk density of each staple fiber sheet was determined in accordance with Japanese Industrial Standard (JIS) C 2111, Section 6.1.

(2) Tensile strength of staple fiber sheet

The tensile strength of each staple fiber sheet was determined in accordance with JIS C 2111, Section 7, using a constant stretching rate type tensile tester.

(3) Interlaminar peeling strength of staple fiber sheet.

In the determination of the interlaminate peeling strength of each staple fiber sheet, a sample of the staple fiber sheet having a length of 200 mm and a width of 15 mm was peel-divided at the middle layer portion thereof at a peeling angle of 180 degrees into two pieces, by a T-peeling method using a constant stretching rate type tensile tester. A stress created on the sample was measured.

(4) Dimensional change of staple fiber sheet at an elevated temperature.

A staple fiber sheet having a length of 250 mm and a width of 50 mm was subjected to a measurement of the longitudinal length of the sheet before and after a heat treatment at a temperature of 280° C. for 5 minutes, by using a high accuracy two dimensional coordinate-measurement tester (made by Mito Kogyo K.K.). The change (%) in the longitudinal length was calculated in accordance with the following equation:

$$Dn(\%) = (Lb - La)/La \times 100$$

wherein Dn represents a change in percent in the longitudinal length of the staple fiber sheet between before and after the heat treatment, Lb represents a longitudinal length of the staple fiber sheet after the heat treatment and La represents a longitudinal length of the sheet before the heat treatment.

(5) Dimensional change of staple fiber sheet due to a dehydration thereof

A sample of a staple fiber fabric was immersed in water at room temperature for one day and night to allow the sample to fully absorb water therein, and then dried at room temperature for about 12 hours. The sample having a width of 5 mm was held at two end portions thereof by a pair of holder of a thermal analyzer (trademark: Thermoflex type thermal analyzer TMA, made by Rigaku Denki K.K.). The initial distance between the holder was 20 mm. The sample was heated in the thermal analyzer from room temperature to 300° C. at a heating rate of 10° C./minute and then cooled from 300° C. to room temperature at a cooling rate of 10° C./minute. The heating and cooling procedures were repeated further twice (three times in total), while recording a dimensional change of the length of the sample on a chart. The initial length of the sample after the water-impregnation and drying step and before the first heating step was compared with the length of the sample after the final cooling step was completed. The difference between the length of the sample after the water-immersing and drying step and before the first heating step and the length of the sample after the final cooling step was calculated, and then the percentage of the length difference based on the sample length after the water-immersing and drying step and before the first heating step was calculated. The lower the length change, the higher the dimensional stability and deformation resistance of the sample in the temperature and water-content-varying conditions.

(6) Deformation of laminate for electric circuit board

A varnish composition was prepared by preparing a mixture of a high-purity brominated bisphenol A-type epoxy resin with an o-cresol novolak type epoxy resin, a curing agent consisting of dicyandiamide and a curing-promoting agent consisting of 2-ethyl-4-methyl-imidazole and dissolving the resultant mixture in a mixed solvent consisting of methylethylketone and methyl cellosolve in a mixing ratio of 50/50 by weight. A sample of a staple fiber sheet was impregnated with the varnish composition, and then the impregnated varnish composition was dried at a temperature of 110° to 120° C. for 5 to 10 minutes, to provide a B stage prepreg sheet having a varnish resin content of 55% by volume.

Two pieces of the prepreg sheet were laminated on both the front and back surfaces of a first copper foil having a thickness of 35 μm, and then, both the front and back surfaces of the resultant laminate was further laminated with two pieces of a second copper foil having a thickness of 18 μm. The resultant laminate was heat-pressed in a reduced pressure atmosphere at a temperature of 170° C. under a pressure of 40 kg/cm$^2$ for 50 minutes, and then cured in a hot air dryer at a temperature of 200° C. for about 20 minutes. A cured laminate for an electric circuit board was obtained. A specimen for the test was prepared by cutting the cured laminate into square pieces having a length and width of 150 mm; and removing center square portions of the second copper foil layers of each square piece, having a length and width of 110 mm, so as to retain edge portions of the second copper foil layers in a square frame form having a width of 20 mm, by means of etching. The resultant partially etched laminate pieces were heat treated at a temperature of 260° C. for 10 minutes. When the specimen was deformed, for example, distorted, curled or corrugated, due to the heat treatment, the maximum deformation of the specimen was measured as a maximum different in the level between the deformed portion and a central portion of the specimen.

(7) Insulation resistance at a high humidity

The same non-etched laminate as in the immediate previous section (6) was used. One surface of the laminate was partially etched to form comb-shaped electrodes at intervals of 0.15 mm and consisting of the second copper foil. The resultant specimen was stored for 1,000 hours while applying a direct voltage of 40V to the electrodes at a temperature of 60° C. at a relative humidity of 95% RH, and then in the atmosphere at a temperature of 20° C. at a relative humidity of 6% RH for one hour. After the storage, a direct voltage of 35 to 90 volts was applied to the electrodes for 60 seconds, to measure the insulation resistance of the specimen.

Example 1

A staple fiber blend was prepared by blending 77 parts by weight of para-type wholly aromatic polyamide staple fibers consisting of a copoly(paraphenylene/3,4'-oxydiphenylene (molar ratio: 50/50) terephthalamide, adhered with 0.5% by weight of talc particles and 0.1% by weight of osmose particles, having an individual fiber thickness of 1.67 d tex (1.5 deniers), a fiber length of 3 mm, and an elongation determined by the above-mentioned method of 0.18%, and available under the trademark of Technora from Teijin Ltd., with 15 parts by weight of meta-type wholly aromatic polyamide staple fibers consisting of poly(metaphenylene isophthalamide), drawn at a draw ratio of 1.4, and having an individual fiber thickness of 3.33 d tex (3 deniers), a fiber length of 6 mm and a shrinkage of 0.6% determined by the above-mentioned method. In this blend, the contents of the para- and meta-type wholly aromatic polyamide staple fibers were 83.7% by weight and 16.3% by weight, respectively.

The staple fiber blend was suspended in water by using a pulper and mixed with 0.03% by weight of a dispersing agent (available under the trademark of Dispersing agent YM-80, from Matsumoto Yushi K.K.) to provide an aqueous staple fiber slurry having a staple fiber content of 0.2% by weight.

The staple fiber slurry was subjected to a paper-forming process using a Tappi type hand paper-forming machine, to provide a wet staple fiber web; an aqueous dispersion of 2% by solid weight of a water-dispersible bisphenol A-epichlorohydrin type epoxy resin (available under the trademark of Dickfine EN-0270, from Dainihon Inkika-gakukogyo K.K.) was sprayed toward the wet staple fiber web; and then the resultant binder-incorporated wet staple fiber web was dried and cured in a hot air dryer at a temperature of 160° C. for 20 minutes.

The resultant wholly aromatic polyamide staple fiber sheet consisted of 92 parts by dry weight of the staple fiber web and 8 parts by weight of the binder resin. The staple fiber sheet was heat-pressed by using a calender machine with a pair of metallic rolls each provided with a hard peripheral surface and having a diameter of 400 mm, at a temperature of 230° C. under a linear pressure of 160 kg/cm. Then, the staple fiber sheet was further heat pressed by using a calender machine with a pair of metallic rolls each provided with a hard peripheral surface and having a diameter of 500 mm, at a temperature of 320° C. under a linear pressure of 200 kg/cm, to soften the meta-type wholly aromatic polyamide staple fibers so as to allow them to bond to the para-type wholly aromatic polyamide staple fibers at portions intersecting each other.

The resultant wholly aromatic polyamide staple fiber sheet had a basis weight of 72 g/m².

The staple fiber sheets were subjected to the above-mentioned tests (1) to (5). The test results are shown in Table 1.

The staple fiber sheet was converted to a prepreg sheet by impregnating the varnish composition and then to a laminate for the electric circuit board in the manner mentioned above.

The laminate was subjected to the deformation test (6) and the insulation resistance measurement (7) at a high humidity as mentioned above. The test results are also shown in Table 1.

Example 2

A wholly aromatic polyamide staple fiber sheet was produced by the same procedures as in Example 1, except that the staple fiber web in an amount of 92 parts by weight was prepared from 86 parts (93.5%) by weight of the same copoly(paraphenylene/3,4'-oxydiphenylene terephthalate) staple fibers and 6 parts (6.5%) by weight of the same poly(metaphenylene isophthalate) staple fibers as those in Example 1.

The results of the tests (1) to (7) are shown in Table 1.

Example 3

A wholly aromatic polyamide staple fiber sheet was produced by the same procedures as in Example 1, except that the staple fiber web in an amount of 92 parts by weight was prepared from 69 parts (75.0%) by weight of the same copoly(paraphenylene/3,4'-oxydiphenylene terephthalate) staple fibers and 23 parts (25%) by weight of the same poly(metaphenylene isophthalate) staple fibers as those in Example 1.

The results of the tests (1) to (7) are shown in Table 1.

Example 4

A wholly aromatic polyamide staple fiber sheet was produced by the same procedures as in Example 1, except that the staple fiber web in an amount of 92 parts by weight was prepared from 72 parts (78.3%) by weight of the same copoly(paraphenylene/3,4'-oxydiphenylene terephthalate) staple fibers as in Example 1 and 20 parts (21.7%) by weight of poly(metaphenylene isophthalate) staple fibers drawn at a draw ratio of 4.3, and having a fiber length of 10 mm and a shrinkage of 0.3% determined by the above-mentioned method.

The results of the tests (1) to (7) are shown in Table 1.

Example 5

A wholly aromatic polyamide staple fiber sheet was produced by the same procedures as in Example 1, except that the staple fiber web in an amount of 92 parts by weight was prepared from 72 parts (78.3%) by weight of the same copoly(paraphenylene/3,4'-oxydiphenylene terephthalate) staple fibers as in Example 1 and 15 parts (16.3%) by weight of poly(metaphenylene isophthalate) staple fibers drawn at a draw ratio of 2.4 and having a fiber length of 6 mm and a shrinkage of 0.5% determined by the above-mentioned method.

The results of the tests (1) to (7) are shown in Table 1.

Example 6

A wholly aromatic polyamide staple fiber sheet was produced by the same procedures as in Example 1, except that the staple fiber web in an amount of 92 parts by weight was prepared from 80 parts (87.0%) by weight of the same copoly(paraphenylene/3,4'-oxydiphenylene terephthalate) staple fibers as in Example 1 and 12 parts (13.0%) by weight of undrawn poly(metaphenylene isophthalate) staple fibers having a fiber length of 6 mm and a shrinkage of 3.5% determined by the above-mentioned method.

The results of the tests (1) to (7) are shown in Table 1.

Example 7

A wholly aromatic polyamide staple fiber sheet was produced by the same procedures as in Example 1, except that the staple fiber web in an amount of 92 parts by weight was prepared from 77 parts (83.7%) by weight of poly (paraphenylene terephthalate) staple fibers (available under the trademark of Kevlar K-29, from Du Pont) having an individual fiber thickness of 1.67 d tex (1.5 deniers), a fiber length of 3 mm and an elongation of 0.08% determined by the above-mentioned method, and 15 parts (16.3%) by weight of the same poly(metaphenylene isophthalate) staple fibers having a fiber length of 6 mm as those in Example 1, except that the shrinkage determined by the above-mentioned method was changed from 0.6% to 0.4% by changing the fiber-producing conditions.

The results of the tests (1) to (7) are shown in Table 1.

Example 8

A wholly aromatic polyamide staple fiber sheet was produced by the same procedures as in Example 1, except that the staple fiber web in an amount of 92 parts by weight was prepared from 77 parts (83.7%) by weight of poly (paraphenylene terephthalate) staple fibers (available under the trademark of Kevlar K-49, from Du Pont) having an individual fiber thickness of 1.58 d tex (1.42 deniers), a fiber length of 3 mm and an elongation of 0.05% determined by the above-mentioned method and 15 parts (16.3%) by weight of the same poly(metaphenylene isophthalate) staple fibers as in Example 7, except that the fiber length was 8 mm.

The results of the tests (1) to (7) are shown in Table 1.

Example 9

A wholly aromatic polyamide staple fiber sheet was produced by the same procedures as in Example 1, except that the staple fiber web in an amount of 92 parts by weight was prepared from 77 parts (83.7%) by weight of the same copoly(paraphenylene/3,4'-oxydiphenylene terephthalate) staple fibers and 15 parts (16.3%) by weight of poly (metaphenylene isophthalate) staple fibers having a fiber length of 6 mm and prepared in accordance with the process as disclosed in Example 1 of Japanese Unexamined Patent Publication No. 4-65,513 at a draw ratio of 1.1 in hot water and further heat-treated to adjust the shrinkage to 0.9% determined by the above-mentioned method.

The results of the tests (1) to (7) are shown in Table 1.

Example 10

A wholly aromatic polyamide staple fiber sheet was produced by the same procedures as in Example 1, except that the staple fiber web in an amount of 95 parts by weight was prepared from 80 parts (84.2%) by weight of the same copoly(paraphenylene/3,4'-oxydiphenylene terephthalate) staple fibers and 15 parts (15.8%) by weight of the same poly(metaphenylene isophthalate) staple fibers as those in Example 1, and the epoxy binder resin was used in an amount of 5 parts by weight.

The results of the tests (1) to (7) are shown in Table 1.

Example 11

A wholly aromatic polyamide staple fiber sheet was produced by the same procedures as in Example 1, except that the staple fiber web in an amount of 85 parts by weight was prepared from 72 parts (84.7%) by weight of the same copoly(paraphenylene/3,4'-oxydiphenylene terephthalate) staple fibers and 13 parts (15.3%) by weight of the same poly(metaphenylene isophthalate) staple fibers as those in Example 1, and the epoxy binder resin was used in an amount of 15 parts by weight.

The results of the tests (1) to (7) are shown in Table 1.

Example 12

A wholly aromatic polyamide staple fiber sheet was produced by the same procedures as in Example 1, except that the staple fiber web in an amount of 75 parts by weight was prepared from 64 parts (85.3%) by weight of the same copoly(paraphenylene/3,4'-oxydiphenylene terephthalate) staple fibers and 11 parts (14.7%) by weight of the same poly(metaphenylene isophthalate) staple fibers as those in Example 1, and the epoxy binder resin was used in an amount of 25 parts by weight.

The results of the tests (1) to (7) are shown in Table 1.

Example 13

A wholly aromatic polyamide staple fiber sheet was produced by the same procedures as in Example 1, except that the fiber length of the copoly(paraphenylene/3,4'-oxydiphenylene terephthalate) staple fibers was changed to 6 mm and the fiber length of the poly(metaphenylene isophthalate) staple fibers was changed to 10 mm.

The results of the tests (1) to (7) are shown in Table 1.

Example 14

A wholly aromatic polyamide staple fiber sheet was produced by the same procedures as in Example 1, except that the staple fiber web in an amount of 92 parts by weight was prepared from 74 parts (80.4%) by weight of the same copoly(paraphenylene/3,4'-oxydiphenylene terephthalate) staple fibers as in Example 1 except that the elongation was changed to 0.1% determined by the above-mentioned method by changing the heat-treating conditions, and 18 parts (19.6%) by weight of the same poly(metaphenylene isophthalate) staple fibers as in Example 9.

The results of the tests (1) to (7) are shown in Table 1.

Example 15

A wholly aromatic polyamide staple fiber sheet was produced by the same procedures as in Example 1, except that the staple fiber web in an amount of 92 parts by weight was prepared from 79 parts (85.9%) by weight of the same copoly(paraphenylene/3,4'-oxydiphenylene terephthalate) staple fibers as in Example 14, except that the elongation was changed to 0.7% determined by the above-mentioned method and 13 parts (14.1%) by weight of the same poly (metaphenylene isophthalate) staple fibers as in Example 14, except that the shrinkage was changed to 3.0% determined by the above-mentioned method by changing the heat-treatment conditions.

The results of the tests (1) to (7) are shown in Table 1.

Comparative Example 1

A wholly aromatic polyamide staple fiber sheet was produced by the same procedures as in Example 1, except that the staple fiber web in an amount of 92 parts by weight was prepared from 89 parts (96.7%) by weight of the same copoly(paraphenylene/3,4'-oxydiphenylene terephthalate) staple fibers and 3 parts (3.3%) by weight of the same poly(metaphenylene isophthalate) staple fibers as those in Example 1.

The results of the tests (1) to (7) are shown in Table 2.

Comparative Example 2

A wholly aromatic polyamide staple fiber sheet was produced by the same procedures as in Example 1, except that the staple fiber web in an amount of 92 parts by weight was prepared from 62 parts (67.4%) by weight of the same copoly(paraphenylene/3,4'-oxydiphenylene terephthalate) staple fibers and 30 parts (32.6%) by weight of the same poly(metaphenylene isophthalate) staple fibers as those in Example 1.

The results of the tests (1) to (7) are shown in Table 2.

Comparative Example 3

A wholly aromatic polyamide staple fiber sheet was produced by the same procedures as in Example 1, except that the staple fiber web in an amount of 97 parts by weight was prepared from 81 parts (83.5%) by weight of the same copoly(paraphenylene/3,4'-oxydiphenylene terephthalate) staple fibers and 16 parts (16.5%) by weight of the same poly(metaphenylene isophthalate) staple fibers as those in Example 1, and the epoxy binder resin was employed in an amount of 3 parts by weight.

The results of the tests (1) to (7) are shown in Table 2.

The resultant staple fiber sheet was frequently broken during the calendering procedures and thus was difficult to continuously process for a long time.

Comparative Example 4

A wholly aromatic polyamide staple fiber sheet was produced by the same procedures as in Example 1, except that the staple fiber web in an amount of 65 parts by weight was prepared from 55 parts (84.6%) by weight of the same copoly(paraphenylene/3,4'-oxydiphenylene terephthalate) staple fibers and 10 parts (15.4%) by weight of the same poly(metaphenylene isophthalate) staple fibers as those in Example 1, and the epoxy resin binder was employed in an amount of 35 parts by weight.

The results of the tests (1) to (7) are shown in Table 2.

During the varnish composition-impregnation procedure, it was found that the varnish composition was difficult to fully penetrate into the inside of the staple fiber sheet and the staple fiber sheet was impregnated unevenly. The resultant prepreg sheet had a number of spots derived from the unevenly impregnated varnish composition and was thus useless in practice.

Comparative Example 5

A wholly aromatic polyamide staple fiber sheet was produced by the same procedures as in Example 1, except that the staple fiber web in an amount of 92 parts by weight was prepared only from the same copoly(paraphenylene/3,4'-oxydiphenylene terephthalate) staple fibers as in Example 1, no poly(metaphenylene isophthalate) staple fibers were employed, and the epoxy resin binder was employed in an amount of 8 parts by weight.

The results of the tests (1) to (7) are shown in Table 2.

The resultant staple fiber sheet was frequently broken in the calendering procedures.

Comparative Example 6

A wholly aromatic polyamide staple fiber sheet was produced by the same procedures as in Example 1, except that the staple fiber web in an amount of 85 parts by weight was prepared only from the same copoly(paraphenylene/3,4'-oxydiphenylene terephthalate) staple fibers as in Example 1, no poly(metaphenylene isophthalate) staple fibers were employed, and the epoxy resin binder was employed in an amount of 15 parts by weight.

The results of the tests (1) to (7) are shown in Table 2.

Comparative Example 7

A wholly aromatic polyamide staple fiber sheet was produced by the same procedures as in Example 1, except that the staple fiber web in an amount of 85 parts by weight was prepared only from the same poly(metaphenylene isophthalate) staple fibers as in Example 1, without using the copoly(paraphenylene/3,4'-oxydiphenylene terephthalate) staple fibers, and the epoxy resin binder was used in an amount of 15 parts by weight.

The results of the tests (1) to (7) are shown in Table 2.

Comparative Example 8

A staple fiber blend was prepared by mixing 60 parts by weight of flocculent staple fibers prepared from poly (paraphenylene terephthalamide) fibers (available under the trademark of Kevlar K 49, from Du Pont) in accordance with the method disclosed in Japanese Examined Patent Publication No. 5-65,640, and having an individual fiber thickness of 1.67 d tex (1.5 deniers) and a fiber length of 3 mm, with 35 parts by weight of fibrillated poly(paraphenylene terephthalamide) pulp fibers having an average fiber length of about 0.8 mm which were prepared by mechanically abrading Kevlar K-29 (trademark) staple fibers made by Du Pont, and 5 parts by weight of fine fibrids precipitated by introducing a solution of a poly(metaphenylene isophthalamide) into a coagulation bath in accordance with the method disclosed in U.S. Pat. No. 3,018,091.

From the resultant staple fiber blend, a wholly aromatic polyamide staple fiber sheet was produced by the same procedures as in Example 1, except that no epoxy resin binder was employed.

The results of the tests (1) to (7) applied to the resultant staple fiber sheet are shown in Table 2.

TABLE 1

| Example No. | Content of binder (wt part) (*)₁ | Content of meta-type aromatic polyamide staple fibers (wt parts) (*)₁ | Staple fiber sheet | | | | | Laminate for electric circuit board | |
|---|---|---|---|---|---|---|---|---|---|
| | | | Bulk density (g/cm³) | Tensile strength (kg/15 mm) | Inter-laminar peeling strength (g/15 mm) | Dimensional change at 280° C. (%) | Dimensional change due to hydration (µm) | Deformation (mm) | Insulation resistance at 95% RH (Ω) |
| 1 | 8 | 16.3 | 0.57 | 4.7 | 32.5 | 0.14 | 28 | 3.1 | $10^{12}$ |
| 2 | 8 | 6.5 | 0.48 | 2.8 | 15.7 | 0.28 | 46 | 4.2 | $10^{13}$ |
| 3 | 8 | 25.0 | 0.72 | 6.9 | 48.4 | 0.24 | 36 | 3.9 | $10^{11}$ |
| 4 | 8 | 21.7 | 0.57 | 4.6 | 31.5 | 0.21 | 32 | 3.6 | $10^{11}$ |
| 5 | 8 | 16.3 | 0.55 | 4.1 | 30.2 | 0.18 | 29 | 3.2 | $10^{12}$ |
| 6 | 8 | 13.0 | 0.66 | 6.6 | 42.4 | 0.14 | 26 | 2.6 | $10^{12}$ |

TABLE 1-continued

| Example No. | Content of binder (wt part) (*)₁ | Content of meta-type aromatic polyamide staple fibers (wt parts) (*)₁ | Staple fiber sheet Bulk density (g/cm³) | Tensile strength (kg/15 mm) | Inter- laminar peeling strength (g/15 mm) | Dimensional change at 280° C. (%) | Dimensional change due to hydration (μm) | Laminate for electric circuit board Deformation (mm) | Insulation resistance at 95% RH (Ω) |
|---|---|---|---|---|---|---|---|---|---|
| 7  | 8  | 16.3 | 0.54 | 5.2 | 32.2 | 0.08 | 17 | 2.1 | 10⁹ |
| 8  | 8  | 16.3 | 0.53 | 5.4 | 28.5 | 0.05 | 14 | 1.8 | 10⁹ |
| 9  | 8  | 16.3 | 0.61 | 5.8 | 39.8 | 0.04 | 16 | 1.9 | 10¹² |
| 10 | 5  | 15.8 | 0.54 | 4.4 | 30.3 | 0.23 | 37 | 3.8 | 10¹² |
| 11 | 15 | 15.3 | 0.62 | 6.1 | 36.2 | 0.11 | 30 | 2.9 | 10¹² |
| 12 | 25 | 14.7 | 0.61 | 5.8 | 28.3 | 0.26 | 40 | 4.1 | 10¹² |
| 13 | 8  | 16.3 | 0.63 | 6.9 | 40.2 | 0.16 | 27 | 3.6 | 10¹² |
| 14 | 8  | 19.6 | 0.64 | 6.0 | 38.3 | 0.08 | 16 | 2.1 | 10¹² |
| 15 | 8  | 14.1 | 0.65 | 6.3 | 40.7 | 0.12 | 23 | 2.4 | 10¹² |

[Note:] (*)₁ ... weight part per 100 parts of the total weight of the staple fiber web and the binder

TABLE 2

| Comparative Example No. | Content of binder (wt part) (*)₁ | Content of meta-type aromatic polyamide staple fibers (wt parts) (*)₁ | Staple fiber sheet Bulk density (g/cm³) | Tensile strength (kg/15 mm) | Inter- laminar peeling strength (g/15 mm) | Dimensional change at 280° C. (%) | Dimensional change due to hydration (μm) | Laminate for electric circuit board Deformation (mm) | Insulation resistance at 95% RH (Ω) |
|---|---|---|---|---|---|---|---|---|---|
| 1 | 8  | 3.3  | 0.41 | 2.1 | 13.2 | 0.36 | 68  | 5.7 | 10¹² |
| 2 | 8  | 32.6 | 0.82 | 7.6 | 52.0 | 0.32 | 52  | 5.3 | 10¹⁰ |
| 3 | 3  | 16.5 | 0.53 | 3.7 | 26.2 | 0.30 | 44  | 5.1 | 10¹¹ |
| 4 | 35 | 15.4 | 0.63 | 5.7 | 39.5 | 0.34 | 55  | 5.2 | 10¹² |
| 5 | 8  | —    | 0.36 | 1.4 | 8.8  | 0.41 | 110 | 7.4 | 10¹³ |
| 6 | 15 | —    | 0.42 | 1.9 | 10.5 | 0.38 | 105 | 6.3 | 10¹³ |
| 7 | 15 | 100  | 0.83 | 9.4 | 72.0 | 0.76 | 195 | 8.4 | 10⁷ |
| 8 | —  | —    | 0.47 | 2.7 | 24.0 | 0.12 | 28  | 3.5 | 10⁸ |

Tables 1 and 2 clearly indicate that the wholly aromatic polyamide staple fiber sheet of the present invention exhibits significantly enhanced dimensional stabilities in the longitudinal and the transverse directions and direction of thickness due to changes in temperature and humidity and a superior electric insulation resistance, in comparison with those of conventional wholly aromatic polyamide sheets. Accordingly, the wholly aromatic polyamide staple fiber sheet of the present invention is useful as a substrate material for a laminate for electric circuit board. Namely, when the staple fiber sheet of the present invention is converted to the laminate and further to the electric circuit board and is used as the electric circuit board, substantially no deformation, for example, distortion, curling or corrugation, occurs. Therefore, the staple fiber sheet of the present invention is specifically useful for a high accuracy electric circuit board and for an electric microcircuit board. Also, even when an electronic part, for example, a leadless ceramic chip carrier (LCCC) or bear chip, which has a low temperature, humidity expansion coefficient is directly placed on and soldered to the staple fiber sheet of the present invention, the resultant product remains highly reliable over a long period of time.

Particularly, the wholly aromatic polyamide staple fiber sheet of the present invention is useful as a substrate material for a laminate for electric circuit board which is required to exhibit a light weight, a high dimensional stability at a high temperature and/or a high humidity and an excellent electric insulation.

We claim:

1. A wholly aromatic polyamide staple fiber sheet, comprising:
   (A) 70 to 96 parts by weight of a staple fiber web comprising a blend of:
      (a) 5 to 30% by weight of meta-type wholly aromatic polyamide staple fibers, and
      (b) 70 to 95% by weight of para-type wholly aromatic polyamide staple fibers, and
   (B) 4 to 30 parts by weight of a binder comprising at least one organic resinous material, and incorporated into the staple fiber web (A).

2. The wholly aromatic polyamide staple fiber sheet as claimed in claim 1, wherein the meta- and para-type wholly aromatic polyamide staple fibers (a) and (b) have, independently from each other, a fiber length in the range of from 2 to 12 mm.

3. The wholly aromatic polyamide staple fiber sheet as claimed in claim 1, wherein the meta-type wholly aromatic polyamide staple fibers (a) have a shrinkage of 0.10 to 10.0% and the para-type wholly aromatic polyamide staple fibers (b) have an elongation of 0.03 to 1.0%, the shrinkage and elongation being determined by (i) immersing the staple fibers (a) or (b) in water at room temperature for 24 hours to allow the staple fibers to absorb water and then drying the water-absorbed staple fibers (a) or (b) at room temperature; (ii) heating the water-absorbed staple fiber (a) or (b) from room temperature to a temperature of 300° C. at a heating rate of 10° C./minute, to dry the water-absorbed staple fibers (a) or (b); (iii) immediately cooling the heated staple fibers (a) or (b) from 300° C. to room temperature at a cooling rate of 10° C./minute, (iv) repeating the heating and cooling steps (ii) and (iii) twice more; and (v) calculating the shrinkage of the staple fibers (a) and the elongation of the staple fibers (b) in accordance the equations (I) and (II), respectively:

$$S(\%) = \frac{L_1 - L_2}{L_1} \times 100 \quad \text{(I)}$$

and $$E(\%) = \frac{L_4 - L_3}{L_3} \times 100 \quad \text{(II)}$$

wherein S represents shrinkage in % of the staple fiber (a), $L_1$ represents length of the staple fibers (a) after the water-immersing and drying step (i) and before the first heating step (ii), $L_2$ represents length of the staple fibers (a) after the final cooling step, E represents elongation in % of the staple fibers (b), $L_3$ represents length of the staple fibers (b) after the water-immersing step (i) and before the first heating step (ii), and $L_4$ represents length of the staple fibers (b) after the final cooling step.

4. The wholly aromatic polyamide staple fiber sheet as claimed in claim 1, wherein the meta-type wholly aromatic polyamide staple fibers (a) 80 to 100 molar % of recurring metaphenylene isophthalamide units and are undrawn or drawn at a draw ratio of 2.8 or less.

5. The wholly aromatic polyamide staple fiber sheet as claimed in claim 1, wherein the para-type wholly aromatic polyamide staple fibers (b) comprise at least one type of staple fibers selected from the group consisting of poly (paraphenylene terephthalamide) staple fibers and copoly (paraphenylene/3,4'-oxydiphenylene terephthalamide) staple fibers.

6. The wholly aromatic polyamide staple fiber sheet as claimed in claim 1, wherein the para-type wholly aromatic polyamide staple fibers are copoly(paraphenylene/3,4'-oxydiphenylene terephthalamide) staple fibers having solid, cation-exchangeable, non-ion-absorbing inorganic compound particles fixed to the surfaces of the staple fibers.

7. The wholly aromatic polyamide staple fiber sheet as claimed in claim 1, wherein the organic resinous material for the binder (B) comprises at least one epoxy resin having one or more epoxy group per molecule thereof.

8. The wholly aromatic polyamide staple fiber sheet as claimed in claim 1, exhibiting a dimensional change of 0.3% or less when heat treated at a temperature of 280° C. for 5 minutes in both of the longitudinal and transverse directions.

9. The wholly aromatic polyamide staple fiber sheet as claimed in claim 1, having a bulk density of 0.45 to 0.80 g/cm$^3$.

10. The wholly aromatic polyamide staple fiber sheet as claimed in claim 1, having a tensile strength of 2.0 kg/15 mm or more and an interlaminar peel strength of 15 g/15 mm or more.

11. The wholly aromatic polyamide staple fiber sheet as claimed in claim 1, wherein the meta-type wholly aromatic polyamide staple fibers (a) are bonded to the para-type wholly aromatic staple fibers (b), at portions of the staple fibers (a) and (b) intersecting each other, at a temperature at which the staple fibers (a) are softened and adhere to the staple fibers (b) under pressure.

* * * * *

UNITED STATES PATENT AND TRADEMARK OFFICE
CERTIFICATE OF CORRECTION

PATENT NO.      : 5,783,039　　　　　　　　　　　　　　　　　　　　　　　　Page 1 of 1
DATED           : July 21, 1998
INVENTOR(S)     : Sadamitsu Murayama It is certified that error appears in the above-identified patent and that said Letters Patent is hereby corrected as shown below:

Item [22] Filed: February 18, 1997, to read -- [February 14, 1997] --.

Signed and Sealed this

Second Day of October, 2001

*Attest:*

*Attesting Officer*

NICHOLAS P. GODICI
*Acting Director of the United States Patent and Trademark Office*